United States Patent
Gardner et al.

[19]

[11] Patent Number: 6,117,739
[45] Date of Patent: Sep. 12, 2000

[54] SEMICONDUCTOR DEVICE WITH LAYERED DOPED REGIONS AND METHODS OF MANUFACTURE

[75] Inventors: Mark I. Gardner, Cedar Creek; Fred N. Hause; Charles E. May, both of Austin, all of Tex.

[73] Assignee: Advanced Micro Devices, Inc., Sunnyvale, Calif.

[21] Appl. No.: 09/166,000

[22] Filed: Oct. 2, 1998

[51] Int. Cl.[7] ................................................ H01L 21/336
[52] U.S. Cl. ...................... 438/289; 438/174; 438/217; 438/276; 438/289; 438/526; 438/529
[58] Field of Search .................... 438/289, 290, 438/291, 174, 217, 276, 278, 526, 529, 918, FOR 205, FOR 16, FOR 162, FOR 163, FOR 313, FOR 314; 148/DIG. 163

[56] References Cited

U.S. PATENT DOCUMENTS

| | | | |
|---|---|---|---|
| 4,163,985 | 8/1979 | Schuermeyer et al. | 357/23 |
| 4,895,520 | 1/1990 | Berg | 437/45 |
| 4,956,573 | 9/1990 | Smith et al. | |
| 5,219,777 | 6/1993 | Kang | 437/44 |
| 5,378,650 | 1/1995 | Kimura | 437/63 |
| 5,413,949 | 5/1995 | Hong | 437/44 |
| 5,429,956 | 7/1995 | Shell et al. | 437/29 |
| 5,470,398 | 11/1995 | Shibuya et al. | 148/33.3 |
| 5,489,543 | 2/1996 | Hong | 437/41 |
| 5,576,574 | 11/1996 | Hong | 257/408 |
| 5,605,855 | 2/1997 | Chang et al. | 437/45 |
| 5,658,811 | 8/1997 | Kimura et al. | 438/289 |
| 5,734,185 | 3/1998 | Iguchi et al. | 257/336 |
| 5,750,430 | 5/1998 | Son | 438/303 |
| 5,773,348 | 6/1998 | Wu | 438/305 |
| 5,792,699 | 8/1998 | Tsui | 438/290 |
| 5,811,339 | 9/1998 | Tseng | 438/289 |
| 5,869,374 | 2/1999 | Wu | 438/291 |

OTHER PUBLICATIONS

Cambell, *The Science of Engineering of Microelectronic Fabrication*, Oxford University Press, pp. 444–446 (1996).
Wolf, *Silicon Processing for the VLSI Era*, Lattice Press, vol. 2: Process Integration, pp. 400–419 (1990).
Wolf, *Silicon Processing for the VLSI Era*, Lattice Press, vol. 3: The Submicron Mosfet, pp. 232–246 (1995).

*Primary Examiner*—Long Pham

[57] ABSTRACT

A semiconductor device can be formed with active regions disposed in a substrate adjacent to a gate electrode and a doped region, of the same conductivity type as the active regions, embedded beneath the channel region defined by the active regions. In one embodiment, a patterned masking layer having at least one opening is formed over the substrate. A dopant material is implanted into the substrate using the masking layer to form active regions adjacent to the opening and an embedded doped region that is between and spaced apart from the active regions and is deeper in the substrate then the active regions. In addition or alternatively, spacer structures can be formed on the gate electrode by forming a conformal dielectric layer along a bottom surface and at least one sidewall of the opening and forming a gate electrode in the opening over the dielectric layer. The masking layer is then removed to leave the dielectric layer between the gate electrode and the substrate and as spacer structures on the sidewalls of the gate electrode.

24 Claims, 3 Drawing Sheets

SEMICONDUCTOR DEVICE WITH LAYERED DOPED REGIONS AND METHODS OF MANUFACTURE

FIELD OF THE INVENTION

The present invention is directed to semiconductor devices and methods of manufacture, and more particularly, to semiconductor devices having a doped region embedded beneath the channel region and doped with the same dopant material as the source/drain regions and/or semiconductor devices with an integrated formation of a gate insulating layer and spacers for a gate electrode.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. Punchthrough and voltage threshold implants may also be performed in the channel region 107. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, may include lightly-doped-drain (LDD) structures. Each LDD structure includes a lightly-doped, lower conductivity (LDD) region 106 near the channel region 107 and a heavily-doped, higher conductivity region 104 typically connected to the source/drain terminal. The LDD region 106 can be formed by lateral thermal diffusion from a more heavily doped region 104. Alternatively, LDD structures can be formed by implanting a first dopant into active regions adjacent the gate electrode 103 at relatively low concentration levels to form the lightly-doped regions 106, forming spacers 102 on sidewalls of the gate electrode 103, and implanting a second dopant into the active regions at higher concentration levels to form the heavily-doped regions 104. The substrate is typically annealed to drive the dopant in the heavily-doped regions deeper into the substrate 101.

Conducting lines (not shown) are formed to connect the gate electrode 103 and the active regions 105 to other devices. To facilitate the contact between the gate electrode 103 and the active regions 105 (particularly when these structures are made using silicon or polysilicon), a metal film is formed over the gate electrode and active regions and the metal is reacted to form a silicide with the exposed silicon. The excess metal is then removed leaving the silicide terminals. Even if spacers are not used to form LDD structures, spacers may be placed on the sidewalls of a gate electrode to prevent silicidation of those sidewalls and restrict the silicidation to the exposed top portion of the gate electrode and the exposed active regions. The spacers prevent or reduce the likelihood of an unwanted short between the gate electrode and the active regions.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET). Semiconductor devices, like the one described above, are used in large numbers to construct most modern electronic devices.

The fabrication of MOS devices, including NMOS, PMOS, and CMOS devices, is highly complex and associated with a number of potential problems. One significant problem is current leakage from active regions to the substrate. Another significant problem, more closely associated with CMOS devices, is known as latchup. Latchup causes the device to source large currents and typically occurs with the formation of a parasitic three-terminal semiconductor device from an active region of the device, a doped well containing the active regions, and the surrounding substrate. A variety of methods have been used to prevent latchup and to reduce current leakage. Such methods include forming isolation regions between neighboring devices and forming punchthrough regions, using the opposite type of dopant as the active regions, below the channel region near the bottom of the active regions. However, as devices become smaller and fabrication complexity increases, new technologies are needed to address these issues.

In addition, each of the steps in the formation of a semiconductor device give rise to additional potential errors in the fabrication of the device and require additional periods of time. Sources of error include, for example, misalignment of device structures, incorrect thicknesses, and shorted structures. There is a need for methods and devices that reduce the number of steps and the time in the fabrication of reliable semiconductor devices. Such methods may include, for example, the formation of two or more different parts of the device using the same process steps.

SUMMARY OF THE INVENTION

Generally, the present invention relates to semiconductor devices with a doped region embedded below the channel region and to semiconductor devices with an integrated gate insulating layer and spacers on the sidewall of the gate electrode and methods of manufacturing these devices. One embodiment of the invention is a method of making a semiconductor device. A patterned masking layer having at least one opening is formed over a substrate. A dopant material is implanted into the substrate using the masking layer to form active regions adjacent to the opening and an embedded doped region that is between and spaced apart from the active regions and is deeper in the substrate than the active regions. The embedded doped region may, for example, serve to prevent or reduce latchup and leakage currents.

Another embodiment of the invention is a semiconductor device having a substrate and a gate electrode disposed over the substrate. Active regions are disposed in the substrate adjacent to the gate electrode and a channel region is defined between the active regions. A doped region, of the same conductivity type as the active regions, is embedded beneath the channel region and spaced apart from the active regions.

Yet another embodiment of the invention is another method of making a semiconductor device. A patterned masking layer having at least one opening is formed over a substrate. A conformal dielectric layer is formed along a bottom surface and at least one sidewall of the opening. A gate electrode is formed in the opening over the dielectric layer. The masking layer is then removed leaving the dielectric layer between the gate electrode and the substrate and on the sidewalls of the gate electrode.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
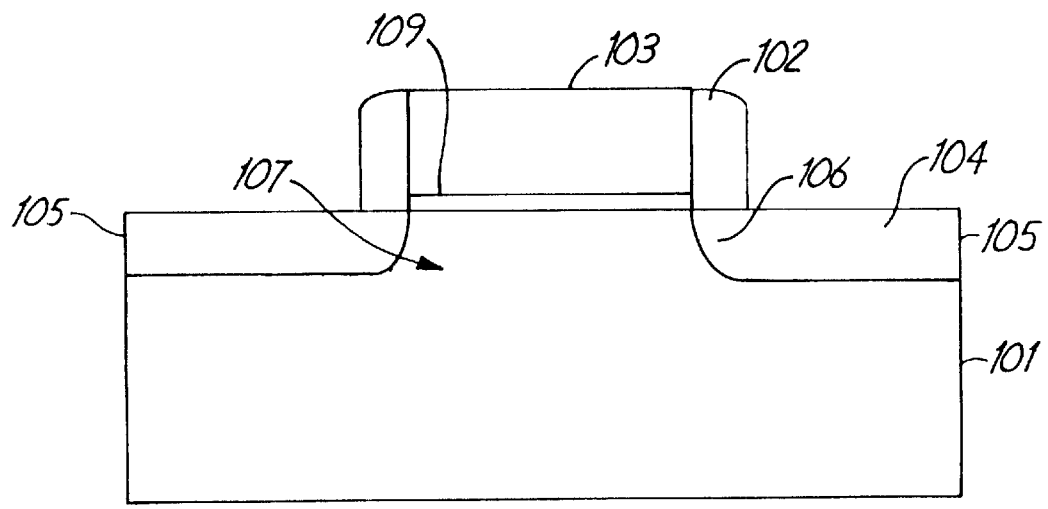
FIG. 1 illustrates a conventional MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to semiconductor devices, including, for example, PMOS, NMOS, CMOS, and BiCMOS semiconductor devices and methods of manufacturing these devices. While the present invention is not so limited, an appreciation of various aspects of the invention will be gained through a discussion of the various application examples operating in such environments.

Figure 2A:
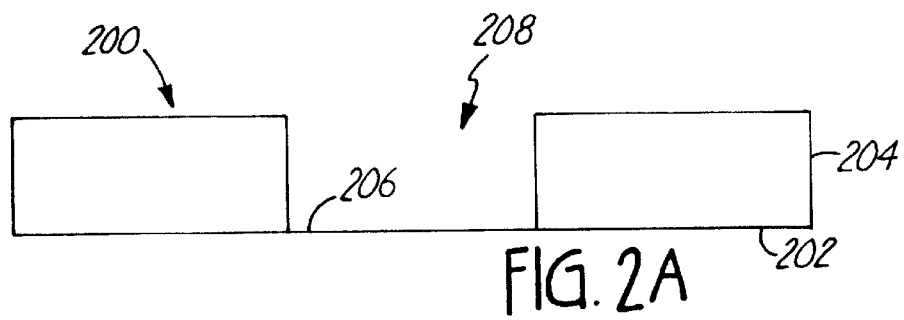
FIGS. 2A–2E illustrate an exemplary process flow for the formation of a semiconductor device according to one embodiment of the invention.

FIGS. 2A through 2E illustrate an exemplary process according to an embodiment of the invention. In this illustrative process, a semiconductor device 200 is formed by depositing a masking layer 204 over a substrate 202, as illustrated in FIG. 2A. The substrate 202 is typically a semiconductor material, including, for example, silicon. The masking layer 204 is typically a dielectric material, such as, for example, an oxide material (e.g., silicon dioxide), a nitride material (e.g., silicon nitride), or an oxynitride material (e.g., silicon oxynitride or $SiO_xN_y$). Other materials may, however, be used for the masking layer, including, for example, photoresist materials, conductive materials (e.g., metals or conducting compounds), and semiconductive materials. The masking layer 204 may be formed using more than one material and more than one layer. The masking layer 204 can be formed by a variety of techniques, including, for example, chemical vapor deposition (CVD), physical vapor deposition, spin-on glass formation, or coating. The masking layer 204 in this embodiment is used to form a gate electrode, as well as active regions adjacent to the gate electrode and an embedded doped region beneath the gate electrode and deeper in the substrate (i.e., further from the upper surface of the substrate) than the active regions. The thickness of the masking layer 204 is selected in consideration of the desired thickness of the gate electrode and/or the spacing between the active regions and the embedded doped region. The masking layer 204 is typically formed at a thickness ranging from, for example, 2000 to 10,000 Angstroms, although thicker or thinner masking layers can be used.

An opening 208 is formed in the masking layer 204 and typically exposes a portion of the surface 206 of the substrate 202, as illustrated in FIG. 2A. The opening 208 is provided for the subsequent formation of a gate electrode. The opening 208 may be formed by, for example, photolithographic techniques, including forming and patterning a photoresist layer (not shown) over the masking layer 204 and etching, typically anisotropically, the opening 208 in the masking layer 204 according to the pattern. The width of the opening 208 is typically somewhat larger than the desired width of the subsequently formed gate electrode 222. Suitable widths range from, for example, 1500 to 4000 angstroms, although larger or smaller openings may be formed.

In other embodiments, the opening does not extend to the surface of the substrate. Instead, a portion of the masking layer is left in the opening over the surface of the substrate. This may be particularly useful if the masking layer includes a dielectric material that can be used as a gate insulating layer or a portion of a gate insulating layer for the subsequently formed gate electrode.

Figure 2B:
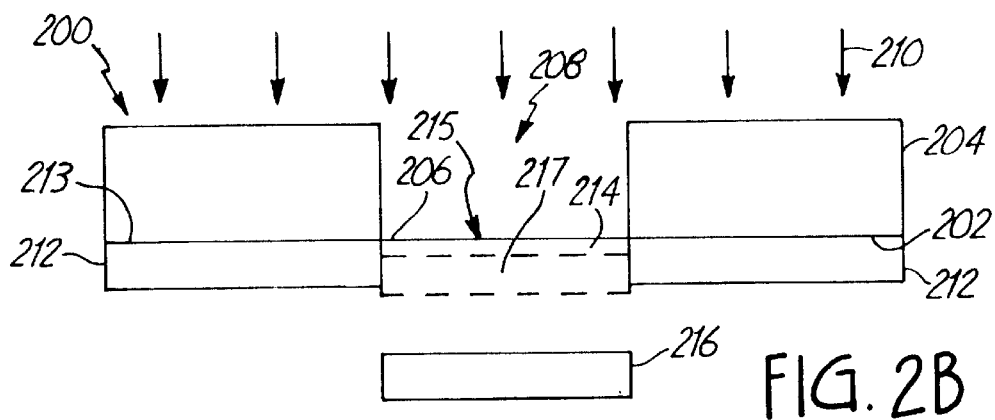

Returning to the illustrated embodiment, after forming the opening 208, a dopant material 210 is implanted into the substrate 202 to form active regions 212 and an embedded doped region 216, as shown in FIG. 2B. The active regions 212 can be used as source or drain regions and define a channel region 214 between the active regions 212. The channel region 214 corresponds, at least roughly, to the opening 208 in the masking layer 204. Typically, the dopant material 210 is implanted so that the dopant material in the active regions 212 extends into the substrate 202 from the surface of the substrate 202. A portion (not shown) of the dopant material may also extend into the masking layer 204.

In addition, to forming the active regions 212, the dopant material 210 is simultaneously implanted through the exposed surface 206 of the substrate 202 to form the embedded doped region 216. The embedded doped region 216 is generally formed below the channel region 214 and deeper in the substrate than the active regions 212 (i.e., the embedded doped region 216 is further from the upper surface 213 of the substrate than the active regions). The spacing between the active regions 212 and the embedded doped region 216 can vary depending on the depth of the opening 208. The embedded doped region 216 is typically about 500 to 8000 angstroms below the active regions 212. This separation is often related to the thickness of the masking layer 204.

The embedded doped region 216 may, for example, advantageously serve to prevent or reduce latchup, especially in CMOS devices. The embedded doped region 216 may also prevent or reduce leakage current from the semiconductor device, and/or act as a getter for stray charge carriers.

The dopant material can be an n-type or a p-type dopant material depending on the type of device being formed. The implant energies and dopant dosages are selected in consideration of the desired depth of the active regions 212 and doped region 216, taking into account the dopant type and thickness of the masking layer 204. Suitable p-type dopant materials include, for example, boron and boron compounds, such as boron hydride or boron halides. Implant energies for these p-type materials may range from, for example, about 0.5 to 2 MeV and dopant dosages may range from, for example, about 2E14 (i.e., $2 \times 10^{14}$) to 8E15 (i.e., $8 \times 10^{15}$) dopant atoms/cm$^2$. Suitable type dopant materials include arsenic or phosphorus with the implant energies increased (or the thickness of the masking layer decreased) due to the higher molecular weight of these materials.

Either prior to or subsequent to implanting the dopant material 210 into the substrate 202, voltage threshold and/or punchthrough implants may be performed to modify the voltage threshold of the channel region 214 and/or to prevent or impede punchthrough in the device. The voltage threshold implant typically forms a lightly-doped region 215 near the substrate surface in the channel region 214. The punchthrough implant typically forms a punchthrough region 217 of the same dopant at the same depth as the active regions 212. Typically, these implants do not extend to the embedded dopant region 216. These regions 215, 217 are typically formed using a dopant material of the opposite conductivity type as that used to form the active regions 212. Both the voltage threshold and punchthrough implants can be performed through the opening 208 in the masking layer 204 or before the formation of the masking layer 204 and/or opening 208.

Figure 2C:
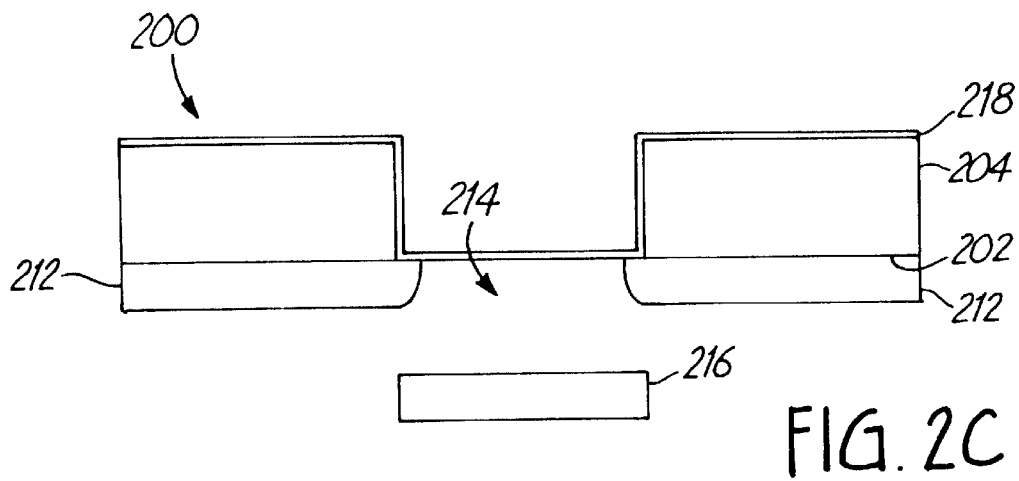

Following the implant of the dopant material 210, the partially fabricated device 200 may be annealed using, for example, rapid thermal anneal (RTA) techniques. This activates the dopant material 210 in the active regions 212 and the embedded doped region 216 and may drive the dopant material deeper into the substrate 202 and provide a more uniform distribution of the dopant material. This may also cause some lateral diffusion of the dopant material, as illustrated in FIG. 2C. During the anneal, a portion of the exposed substrate may also be thermally oxidized to form an oxide dielectric layer. This dielectric layer may be used as an insulating layer for the gate electrode or may be removed, as in the illustrated embodiment.

The temperature to which the substrate 201 is heated during the anneal typically ranges from, for example, 800 to 950° C. for periods of time ranging from, for example, 30 to 60 seconds. This anneal may be performed at any time in the process after the implantation of the dopant material 210. However, if the gate electrode 222 (see FIG. 2D) is formed using a metal, the anneal is typically performed prior to formation of the gate electrode as the relatively high temperatures of the anneal may disturb or damage a metal gate electrode.

A dielectric layer 218 is formed on the bottom and sidewalls of the opening 208, as shown in FIG. 2C. The dielectric layer 218 is typically formed using conformal chemical vapor deposition or other techniques which allow controllable and uniform formation of the dielectric layer 218 on the exposed surface 206 of the substrate 202 and on the sidewalls of the opening 208. The dielectric layer 218 is used, at least in part, as a gate insulating layer and spacers for a gate electrode. Alternatively, if a remaining portion of the masking layer 204 or a thermal oxide layer (not shown) is provided on the surface of the substrate 202 in the opening 208, then the dielectric layer 218 may be formed over either of these layers.

The dielectric layer 218 can be formed using a variety of materials. In some embodiments, the dielectric layer 218 is formed using silicon dioxide, silicon nitride, silicon oxynitride, or nitrided silicon dioxide. In other embodiments, the dielectric layer 218 is formed using one or more materials that have a dielectric constant (K) greater than silicon dioxide (K of approximately 4.2). Such high-K dielectric materials often have a dielectric constant of 8 or greater (for example, ranging from 8 to 10,000). Examples of suitable high-K materials and their approximate dielectric constants include, for example, $TiO_2$ (dielectric constant of 86), lead lanthanum zirconate titanate (PLZT, dielectric constant of 29), $Ta_2O_5$ (dielectric constant of 50), and other metal oxides.

The thickness of the dielectric layer 218 is suitably selected based on the desired capacitive characteristics of the gate insulating layer. The thickness of a dielectric layer 218 formed using a high-K dielectric material may range from, for example, 10 to 100 Angstroms, although thicker or thinner dielectric layers may also be used. This thickness may be reduced when using a dielectric layer made from silicon dioxide or when forming the dielectric layer over a remaining portion of the masking layer left in the opening or a thermal oxide layer, as described above.

Figure 2D:
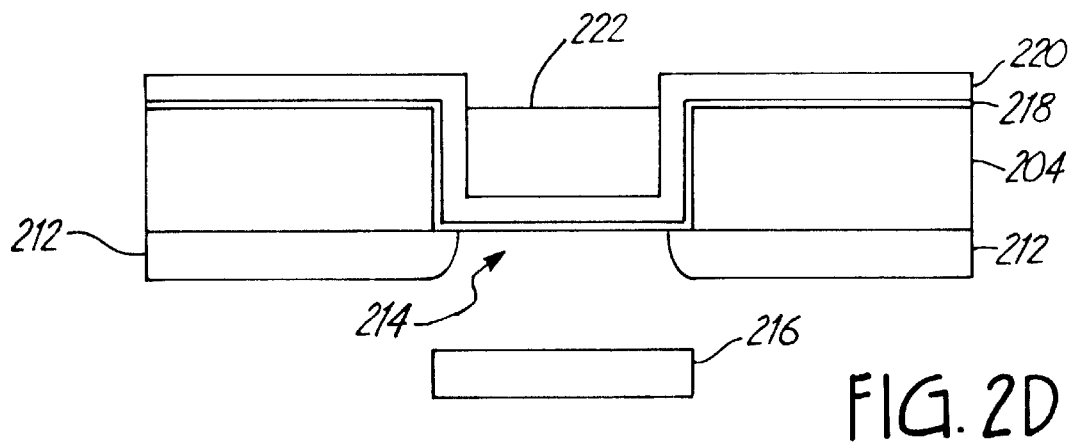

An optional barrier layer 220 can be formed over the dielectric layer 218, as shown in FIG. 2D. The barrier layer 220 may, for example, be formed in a similar manner as the dielectric layer 218 above (e.g., using conformal chemical vapor deposition). This barrier layer 220 is particularly useful if the subsequently-formed gate electrode 222 is made of a metallic material. The barrier layer 220 can prevent or reduce the diffusion of the metallic material into the dielectric layer 218 and/or better wet the surface of the dielectric layer 218 to improve adhesion of the gate electrode material. The barrier layer 220, is typically formed using a metal compound, such as, for example, titanium nitride or tantalum nitride. The barrier layer is, at least in some instances, formed using a conductive material.

The thickness of the barrier layer 220 can range from, for example, 100 to 500 angstroms. However, thinner or thicker barrier layers can be used depending on the size of the dielectric layer 218 and the gate electrode 222.

A gate electrode 222 is formed within the opening 208, as shown in FIG. 2D. The gate electrode material 222 may be formed, for example, by depositing a layer of gate electrode material over the substrate and polishing the gate electrode material to form the gate electrode 222. The may be done using known deposition and polishing techniques. The gate electrode 222 may be polished to the upper surface of the masking layer 204, although this is not necessary. The gate electrode 222 is typically formed of a conductive material, such as, for example, polysilicon or a metallic material, including, for example, copper, titanium, tungsten, aluminum, iridium, or cobalt.

Figure 2E:
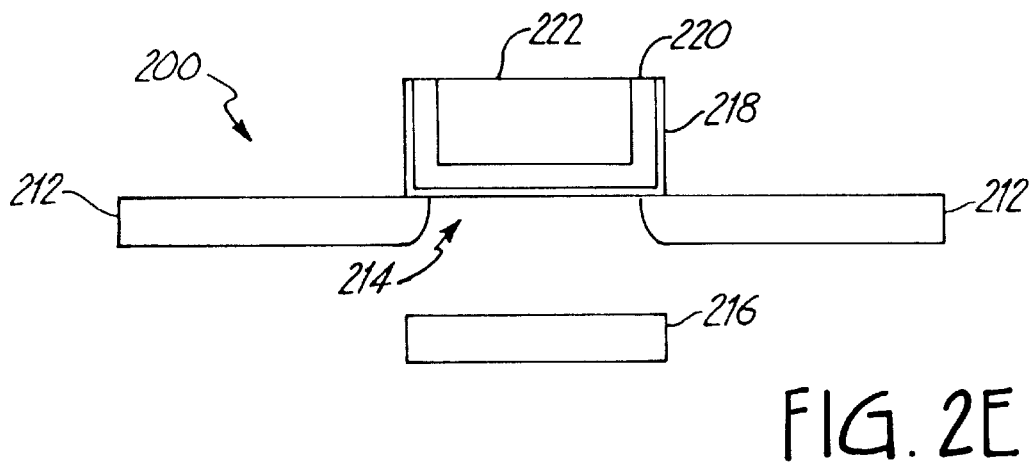

Portions of the optional barrier layer 220 and dielectric layer 218 above the masking layer 204, as well as the masking layer 204, may be removed, as shown in FIG. 2E. Typically, the portions of the barrier layer 220 and the dielectric layer 218 are removed prior to removing the masking layer 204. These portions of the barrier layer 220 and the dielectric layer 218 can be removed simultaneously or separately by techniques, including, for example, anisotropic etching, isotropic etching, selective etching, or flashing. The masking layer 204 may then be removed by a selective technique to leave the sidewall portions of the optional barrier layer 220 and the dielectric layer 218 between the masking layer 204 and the gate electrode 222. This provides spacer structures on the gate electrode 222. Selective techniques for removing the masking layer 204 include, for example, selective isotropic or anisotropic etching techniques. For example, a selective etchant may be used to remove a silicon dioxide masking layer 204 while leaving a dielectric layer 218 formed of a high-K material or a selective etchant may be used to remove a silicon nitride masking layer 204 while leaving a silicon dioxide dielectric layer 218. Fabrication may continue with well-known processing steps including, for example, silicidation, interlayer dielectric formation, interconnect formation, conducting line formation, and so forth to complete the ultimate device structure.

As noted above, the present invention is applicable to a number of different semiconductor devices where formation of embedded doped regions and/or the integrated formation of gate insulating layer and spacer structures are desirable. Using the above process, an embedded doped region can be formed beneath the channel region. This embedded doped region may prevent or reduce current leakage and/or latchup. In addition, an integrated gate insulating layer and spacer structures can be formed. This integrated formation process may reduce the number of steps needed for the formation of a device.

While the illustrated process shows the formation of both an embedded doped region and integrated gate insulating layer and spacer structures, these features need not be formed together. For example, in some embodiments, the integrated insulating layer and spacer structures formed from the optional barrier layer 220 and the dielectric layer 218 can be made according to the process illustrated in FIGS. 2C through 2E without forming the embedded doped region 216. For example, the doping of the active regions may be performed prior to the formation of an opening in the masking layer or after formation of the gate electrode and removal of the masking layer.

In other embodiments, the embedded doped region and active regions may be formed as illustrated in FIGS. 2A and 2B without formation of an integrated gate insulating layer and spacer structure. A gate insulating layer may be provided for the gate electrode by forming, for example, a dielectric layer on the bottom, but not the sidewalls, of the opening using techniques, such as, thermal oxidation, sputtering, or spin on coating. This dielectric layer can be formed prior to or subsequent to the implantation of the dopant material. Alternatively or additionally, a portion of the masking layer can be left in the opening to form at least a portion of the gate insulating layer, rather than exposing the substrate. After the implantation of the dopant material, a gate electrode can then be formed over the dielectric layer and/or the remaining portion of the masking layer in the opening. Spacer structures can be formed conventionally, including, for example, depositing a spacer layer over the gate electrode and then anisotropically etching the spacer layer to leave the spacer structures on at least one sidewall of the gate electrode.

The present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of making a semiconductor device, comprising:

forming, over a substrate, a patterned masking layer having at least one opening;

implanting a dopant material into the substrate using the masking layer to form active regions adjacent to the opening and an embedded doped region that is between and spaced apart from the active regions and is deeper in the substrate than the active regions; and forming a dielectric layer over a bottom and one or more sidewalls of the opening.

2. The method of claim 1, wherein forming a masking layer comprises forming a masking layer over the substrate, and removing a portion of the masking layer to form at least one opening.

3. The method of claim 2, wherein removing a portion of the masking layer comprises removing a portion of the masking layer to form at least one opening in the masking layer that exposes a portion of the substrate.

4. The method of claim 1, wherein the dielectric layer comprises a dielectric material having a dielectric constant of at least 8.

5. The method of claim 1, further comprising forming a gate electrode in the opening and over the dielectric layer.

6. The method of claim 5, wherein the gate electrode comprises a metal.

7. The method of claim 6, further comprising forming a barrier layer between the dielectric layer and the gate electrode.

8. The method of claim 1, wherein forming a dielectric layer comprises forming a dielectric layer in the opening over a remaining portion of the masking layer.

9. The method of claim 1, further comprising removing the masking layer after forming the one or more active regions.

10. The method of claim 1, wherein the dopant material comprises boron or a boron compound.

11. The method of claim 1, further comprising implanting a second dopant material, of a conductivity type different than the dopant material implanted to form the active regions and the embedded doped region, to form a voltage threshold region or punchthrough region in the substrate.

12. A method of making a semiconductor device, comprising:

forming, over a substrate, a patterned masking layer having at least one opening;

implanting a dopant material into the substrate using the masking layer to form active regions adjacent to the opening and an embedded doped region that is between and spaced apart from the active regions and is deeper in the substrate than the active regions;

forming a dielectric layer over a bottom and one or more sidewalls of the opening;

forming a gate electrode over the dielectric layer; and removing the masking layer leaving a portion of the dielectric layer between the gate electrode and the substrate and on at least one sidewall of the gate electrode.

13. The method of claim 12, further comprising forming a barrier layer over the dielectric layer before forming the gate electrode.

14. The method of claim 12, wherein the dielectric layer comprises a dielectric material having a dielectric constant of at least 8.

15. A method of making a semiconductor device comprising:

forming, over a substrate, a patterned masking layer having at least one opening;

forming a conformal dielectric layer along a bottom surface and at least one sidewall of the opening;

forming a gate electrode, including a metallic material, in the opening and over the dielectric layer;

removing the masking layer; and forming a barrier layer between the dielectric layer and the gate electrode.

16. The method of claim 15, wherein the dielectric layer comprises a dielectric material having a dielectric constant of 8 or greater.

17. A method of making a semiconductor device, comprising:

forming, over a substrate, a single patterned masking layer having at least one opening; and implanting a dopant material into the substrate using the masking layer to form active regions adjacent to the opening and an embedded doped region that is between and spaced apart from the active regions and is deeper in the substrate than the active regions; and forming a dielectric layer over a bottom and one or more sidewalls of the opening.

18. The method of claim 17, wherein forming a masking layer comprises forming a masking layer over the substrate, and removing a portion of the masking layer to form at least one opening.

19. The method of claim 18, wherein removing a portion of the masking layer comprises removing a portion of the masking layer to form at least one opening in the masking layer that exposes a portion of the substrate.

20. The method of claim 17, wherein the dielectric layer comprises a dielectric material having a dielectric constant of at least 8.

21. The method of claim 17, further comprising forming a gate electrode in the opening and over the dielectric layer.

22. The method of claim 21, wherein the gate electrode comprises a metal.

23. The method of claim 22, further comprising forming a barrier layer between the dielectric layer and the gate electrode.

24. The method of claim 17, wherein forming a dielectric layer comprises forming a dielectric layer in the opening over a remaining portion of the masking layer.

* * * * *